(12) United States Patent
Erez et al.

(10) Patent No.: US 9,841,918 B2
(45) Date of Patent: Dec. 12, 2017

(54) FLASH MEMORY DEVICE INCLUDING DEDUPLICATION, AND RELATED METHODS

(71) Applicant: SAMSUNG ELECTRONICS CO., LTD., Suwon-si, Gyeonggi-Do (KR)

(72) Inventors: Elona Erez, Ramat Gan (IL); Avner Dor, Ramat Gan (IL); Jun Jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 180 days.

(21) Appl. No.: 14/956,715

(22) Filed: Dec. 2, 2015

(65) Prior Publication Data

US 2017/0160978 A1    Jun. 8, 2017

(51) Int. Cl.
*G06F 3/06* (2006.01)
(52) U.S. Cl.
CPC .......... *G06F 3/0641* (2013.01); *G06F 3/0604* (2013.01); *G06F 3/0679* (2013.01)
(58) Field of Classification Search
CPC ..... G06F 3/0641; G06F 3/0604; G06F 3/0679
See application file for complete search history.

(56) References Cited

U.S. PATENT DOCUMENTS

| 8,245,094 | B2 | 8/2012 | Jiang et al. |
| 8,285,916 | B2 | 10/2012 | Nishihara et al. |
| 8,321,648 | B2 | 11/2012 | Condict |
| 8,407,378 | B2 | 3/2013 | Marulkar |
| 8,423,866 | B2 | 4/2013 | Dusija et al. |
| 9,146,856 | B2 * | 9/2015 | Dover ................. G06F 12/0246 |
| 9,690,512 | B2 * | 6/2017 | Shany ................... G06F 3/0641 |

(Continued)

OTHER PUBLICATIONS

Zhang X, Li J, Zhao K, Wang H, Zhang T. Leveraging progressive programmability of SLC flash pages to realize zero-overhead delta compression for metadata storage. InProceedings of the 7th USENIX Conference on Hot Topics in Storage and File Systems Jul. 6, 2015 (pp. 5-5). USENIX Association.*

(Continued)

*Primary Examiner* — Ramon A. Mercado
(74) *Attorney, Agent, or Firm* — Volentine & Whitt, PLLC (57) ABSTRACT

A flash memory device includes physical pages that store data sectors therein. The method of operating the flash memory device includes receiving write data sectors to be stored in the flash memory device, pairing the write data sectors with write data sectors and with written data sectors previously stored in physical pages of the flash memory device based upon a matching and deduplication operation to define data sector pairs and a difference therebetween, and rewriting to the physical pages of the flash memory device, in a partial-page writing mode, to store the difference between the write data sector and its respective paired data sector. The partial-page writing mode is performed on a respective physical page after a previous programming and before erasing. The written data sectors included in the data sector pairs only partially occupy the corresponding physical page of the flash memory device. The difference between the write data sector and its respective paired data sector is stored in an unoccupied portion of the corresponding physical cal page of the flash memory device.

9 Claims, 10 Drawing Sheets

(56) References Cited

U.S. PATENT DOCUMENTS

| | | | |
|---|---|---|---|
| 2006/0087893 A1 | 4/2006 | Nishihara et al. | |
| 2010/0223441 A1 | 9/2010 | Lillibridge et al. | |
| 2010/0318729 A1 | 12/2010 | Himeno | |
| 2012/0030413 A1* | 2/2012 | Miyagawa | G06F 12/0246 711/103 |
| 2012/0144095 A1* | 6/2012 | Han | G06F 12/0246 711/103 |
| 2012/0260021 A1* | 10/2012 | Rudelic | G06F 3/0641 711/103 |
| 2013/0013618 A1 | 1/2013 | Heller et al. | |
| 2013/0262422 A1* | 10/2013 | Bates | G06F 11/1004 707/699 |
| 2014/0059279 A1* | 2/2014 | He | G06F 12/0246 711/103 |
| 2016/0139982 A1* | 5/2016 | Yu | G11C 14/0018 714/768 |
| 2016/0328154 A1* | 11/2016 | Mizushima | G11C 7/1006 |
| 2017/0131943 A1* | 5/2017 | Le | G06F 3/0647 |
| 2017/0149451 A1* | 5/2017 | Shany | G06F 3/0641 |

OTHER PUBLICATIONS

Diwaker Gupta, Sangmin Lee, Michael Vrable, Stefan Savage, Alex C. Snoeren, George Varghese, Geoffrey M. Voelker, and Amin Vandat. 2010. Difference engine: harnessing memory redundancy in virtual machines. Commun. ACM 53, 10 (Oct. 2010), 85-93.*

Jesung Kim, Jong Min Kim, S. H. Noh, Sang Lyul Min and Yookun Cho, "A space-efficient flash translation layer for CompactFlash systems," in IEEE Transactions on Consumer Electronics, vol. 48, No. 2, pp. 366-375, May 2002.*

* cited by examiner

FLASH MEMORY DEVICE INCLUDING DEDUPLICATION, AND RELATED METHODS

FIELD

The inventive concept is generally directed to a flash memory device and a memory controller, and more particularly, relates to a flash memory device, a memory controller, and operating methods thereof.

BACKGROUND

Semiconductor memory devices include volatile memory devices and nonvolatile memory devices. Read and write speeds of the volatile memory device are fast, while they lose contents stored therein at power-off. In contrast, the nonvolatile memory devices retain contents stored therein even at power-off. Thus, the nonvolatile memory devices are used to store contents which must be retained regardless of whether power is supplied.

Examples of a volatile memory device include a static RAM (SRAM), a dynamic RAM (DRAM), a synchronous DRAM (SDRAM), etc. A nonvolatile memory device retains its stored data even when its power supply is interrupted. Examples of a nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc. A flash memory may be classified into a NOR type flash memory and a NAND type flash memory.

In particular, among nonvolatile memory devices, a flash memory device is advantageous to an appliance as an auxiliary mass storage device in that it is highly integrated as compared with a conventional EEPROM.

A variety of memory systems have been produced with use of the flash memory. The memory system stores or reads data at or from the flash memory through a protocol. A variety of techniques have been proposed to shorten a time taken to conduct the write or read operation of the memory system.

A storage device that uses a flash memory as the storage medium is considered to have increased life span, less power consumption and better access time in comparison to a storage device that includes disk drives.

A block in a flash memory is a storage area of a unit for collectively erasing data, and a page is a unit for reading and writing data. A plurality of pages may be provided in a single block. Due to its characteristic feature, the flash memory is not typically able to directly rewrite data. In other words, when the flash memory is to rewrite data stored therein, it saves the stored valid data in another block, and then erases the stored data in block units. The flash memory thereafter writes data into the block from which the data was erased.

Deduplication (also referred to as data duplication reduction) is for reducing the capacity cost of storage devices. Deduplication associates a plurality of logical blocks storing identical data with one physical block storing such data, and enables the economization of the storage data capacity. With the use of deduplication, since it is possible to reduce the data rewriting count, the life span of the flash memory can be prolonged. Also the storage capacity of the device may be increased.

SUMMARY

According to an aspect of the inventive concepts, a flash memory device includes physical pages that store data sectors therein. A method of operating the flash memory device includes receiving write data sectors to be stored in the flash memory device, pairing the write data sectors with write data sectors and with written data sectors previously stored in physical pages of the flash memory device based upon a matching and deduplication operation to define data sector pairs and a difference therebetween, and rewriting to the physical pages of the flash memory device, in a partial-page writing mode, to store the difference between the write data sector and the respective data sector of the data sector pairs. In a partial-page writing mode it is possible to reconstruct a page, after it is initially written.

In various embodiments, the partial-page writing mode is performed on a respective physical page after a previous programming and before erasing, and the written data sectors included in the data sector pairs only partially occupy the corresponding physical page of the flash memory device. In certain embodiments, the difference between the write data sector and written data sector of the respective data sector pair is stored in an unoccupied portion of the corresponding physical page of the flash memory device. The advantage of this approach is simplicity and generality. The read latency may be increased since two physical pages need to be read to read one logical page.

The flash memory device may include blocks defined by a plurality of physical pages, and wherein pairing includes matching respective write data sectors of sets of write data sectors with respective write data sectors and with written data sectors in blocks of physical pages to reduce or minimize the differences therebetween.

The matching and deduplication operation may maximize a number of data sector pairs that can be deduplicated. The matching and deduplication operation may include maximal weighted bipartite matching between the write data sectors and the paired write data sectors or written data sectors. The matching may also minimize the size of the representation size of the difference (delta) between the two pages, and thus save occupied flash area.

Also, in various embodiments, the physical pages include an array of memory cells, including multi-level cells (MLC) or triple-level cells (TLC), coupled between word lines and bit lines. As such, rewriting may include storing the difference between the write data sector and written data sector of respective data sector pairs at memory cells of alternating word lines in the corresponding physical page. This may decrease the coupling effect incurred at the time of rewrite as such coupling may change the values read by pages in neighboring wordlines.

Another aspect of the inventive concept is directed to a method of operating a NAND flash memory device including blocks of physical pages that store data sectors therein. The method includes receiving sets of write data sectors to be stored in the NAND flash memory device, pairing the write data sectors of a set with write data sectors and with written data sectors that partially occupy a corresponding physical page within a block of the NAND flash memory device to define data sector pairs and a difference therebetween, and performing deduplication to jointly store the data sector pairs and their difference in a respective same physical page of the block.

Performing deduplication may include rewriting to the physical pages of the NAND flash memory device, in a partial-page writing mode, to store the difference between the write data sector and written data sector of respective data sector pairs. The partial-page writing mode may be performed on a respective physical page after a previous programming and before erasing.

According to yet another aspect of the inventive concept, a data storage system includes a flash memory device having blocks of physical pages configured to store data sectors therein, and a memory controller configured to receive sets of write data sectors to be stored in the flash memory device, pair the write data sectors of a set with written data sectors that partially occupy a corresponding physical page within a block of the flash memory device to define data sector pairs and a difference therebetween, and perform deduplication to jointly store the data sector pairs and their difference in a respective same physical page of the block of the flash memory device.

The features of the embodiments of the inventive concept may reduce write amplification and improve the performance of deduplication.

BRIEF DESCRIPTION OF THE DRAWINGS

The above and other aspects and features of the inventive concept will become readily understood from the detailed description that follows, with reference to the accompanying drawings, in which.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, the terms first, second, etc. may be used to describe various elements, but these elements should not be limited by these terms. Rather, these terms are used merely to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The inventive concept will now be described more fully with reference to the accompanying drawings, in which exemplary embodiments are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. As the inventive concept allows for various changes and numerous embodiments, exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the drawings, like reference numerals denote like elements and sizes of structures may be exaggerated for clarity.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
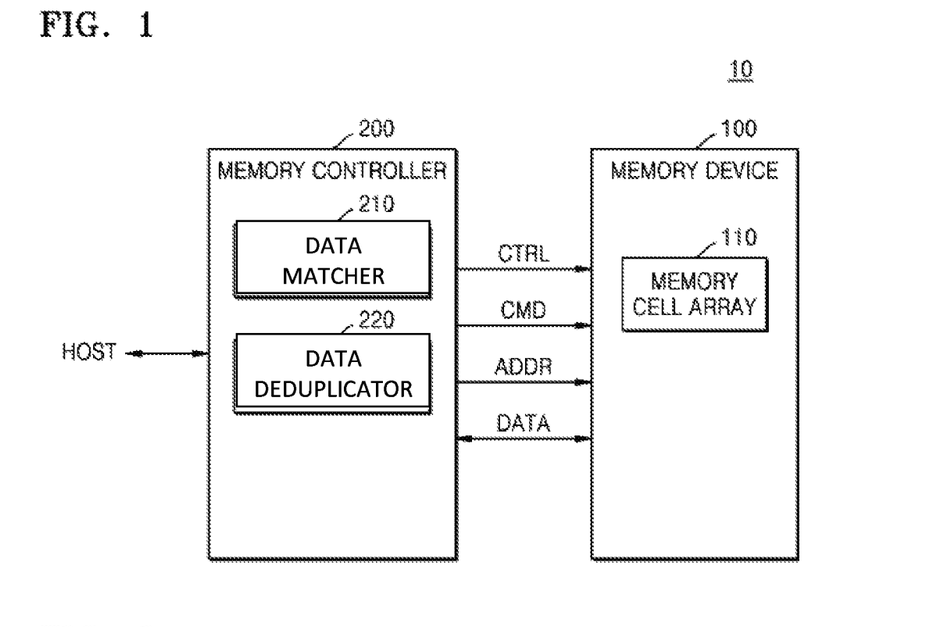
FIG. 1 is a block diagram illustrating a memory system according to an exemplary embodiment.

FIG. 1 is a block diagram illustrating a memory system 10 according to an exemplary embodiment. Referring to FIG. 1, the memory system 10 may include a memory device 100 and a memory controller 200. The memory device 100 may include a memory cell array 110, and the memory controller 200 may include a data matcher 210, and a data deduplicator 220.

Figure 2:
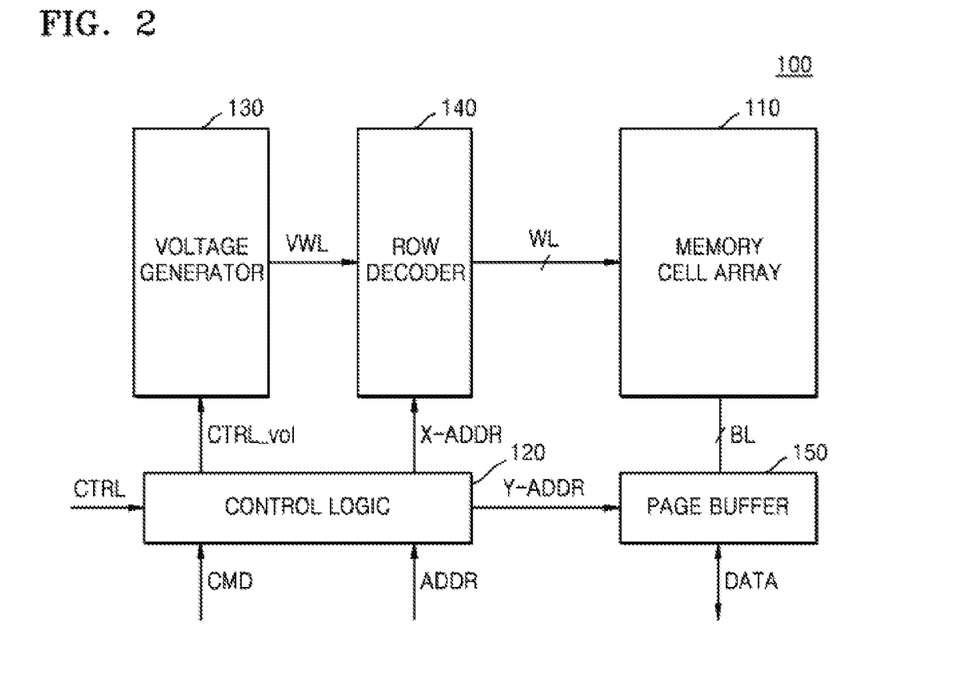
FIG. 2 is a detailed block diagram illustrating a memory device that is included in the memory system of FIG. 1, according to an exemplary embodiment.

The memory cell array 110 may include a plurality of memory cells (not shown) that are provided at intersections between a plurality of word lines WL (see FIG. 2) and a plurality of bit lines BL (see FIG. 2). In an exemplary embodiment, the plurality of memory cells may be flash memory cells, and the memory cell array 110 may be a NAND flash memory cell array, for example.

The following exemplary embodiments will be explained on the assumption that the plurality of memory cells are NAND flash memory cells. For example, the plurality of memory cells may be two-dimensional (2D) horizontal NAND flash memory cells (see FIG. 4). Alternatively, the plurality of memory cells may be three-dimensional (3D) vertical NAND flash memory cells (see FIGS. 6 and 7). However, the inventive concept is not limited thereto, and in another exemplary embodiment, the plurality of memory cells may be resistive memory cells such as resistive random-access memory (RRAM) cells, phase change RAM (PRAM) cells, or magnetic RAM (MRAM) cells.

In the present exemplary embodiment, the memory cell array 110 may be divided into a plurality of memory groups, and each of the plurality of memory groups may include a plurality of memory cells. For example, the plurality of memory groups may be divided according to memory blocks. Alternatively, the plurality of memory groups may be divided according to word lines. Alternatively, the plurality of memory groups may be divided according to pages. Alternatively, the plurality of memory groups may be divided according to dies. However, the inventive concept is not limited thereto, and the plurality of memory groups may be divided according to arbitrary program units.

In an exemplary embodiment, each of memory cells that are included in the memory cell array 110 may be a single-level cell (SLC) that stores 1-bit data. In another exemplary embodiment, each memory cell of the memory cell array 110 may be a multi-level cell (MLC) that stores 2-bit data. In another exemplary embodiment, each memory cell of the memory cell array 110 may be a triple-level cell (TLC) that stores 3-bit data. However, the inventive concept is not limited thereto, and in another exemplary embodiment, each memory cell of the memory cell array 110 may store 4 or more bits of data.

The memory controller 200 may control the memory device 100 to read data that is stored in the memory device 100 or to write data to the memory device 100 in response to a read or write request from a host HOST. Also, the memory controller 200 may control the memory device 100 to perform, for example, an operation related to a sudden power-off, a read reclaim operation, or a wear leveling operation according to an internal request instead of a request from the host HOST. Such a control operation may be referred to as a background operation.

In detail, the memory controller 200 may control a program (or a write) operation, a read operation, and an erase operation of the memory device 100 by applying an address ADDR, a command CMD, and a control signal CTRL to the memory device 100. Also, data DATA for a program operation and read data DATA may be transmitted/received between the memory controller 200 and the memory device 100.

The data matcher 210 is configured to pair received write data sectors of a set with other write data sectors and/or written data sectors that partially occupy a corresponding physical page within a block of the memory device 100 to define data sector pairs and a difference therebetween. Such pairing may include matching respective write data sectors of sets of write data sectors with respective other data sectors in blocks of physical pages to reduce or minimize the differences therebetween.

The data deduplicator 220 is configured to perform deduplication to jointly store the data sector pairs and their difference in a respective same physical page of the block of the memory device 100.

Performing deduplication may include rewriting to the physical pages of the memory device 100, in a partial-page writing mode, to store the difference between the write data sector and paired data sector of respective data sector pairs. The partial-page writing mode may be performed on a respective physical page after a previous programming and before erasing. In other words, an additional programming is allowed without an intervening erasing step.

In certain embodiments, the difference between the write data sector and paired data sector of the respective data sector pair is stored in an unoccupied portion of the corresponding physical page of the memory device 100.

The matching and deduplication operation may maximize a number of data sector pairs that can be deduplicated. The matching and deduplication operation may include maximal weighted bipartite matching between the write data sectors and the written data sectors, as will be described in further detail below.

Also, in various embodiments, the memory cell array 110 may include multi-level cells (MLC) or triple-level cells (TLC) coupled between word lines WL and bit lines BL. As such, rewriting may include storing the difference between the write data sector and paired data sector of respective data sector pairs at memory cells of alternating word lines WL in the corresponding physical page.

Figure 9:
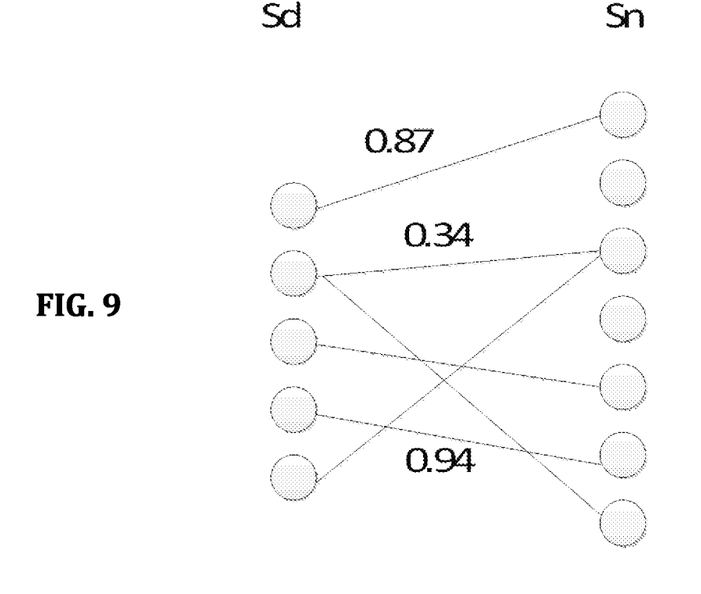
FIG. 9 is an example of a bipartite graph representing data sectors as nodes therein according to an exemplary embodiment.
Figure 10:
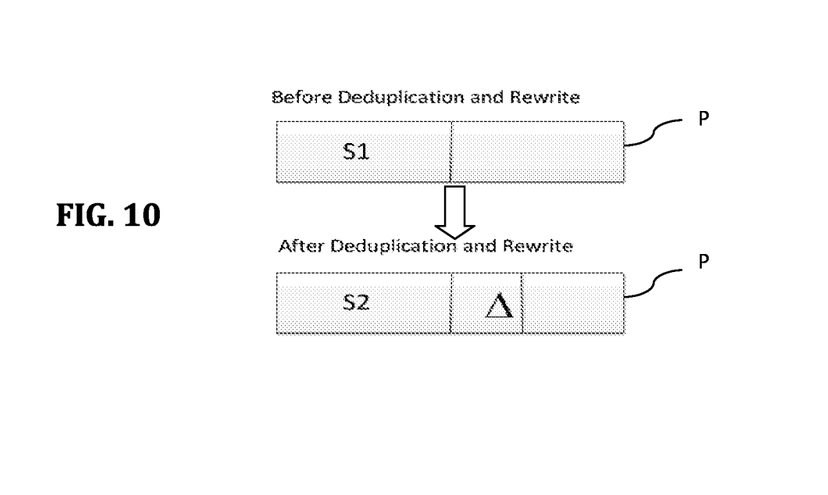
FIG. 10 is a schematic diagram illustrating a physical page before/after deduplication and rewrite according to an exemplary embodiment.

The data matching and deduplicating in accordance with features of the inventive concept will be described in further detail below with additional reference to FIGS. 9 and 10.

FIG. 2 is a detailed block diagram illustrating the memory device 100 that is included in the memory system 10 of FIG. 1, according to an exemplary embodiment. Referring to FIG. 2, the memory device 100 may include the memory cell array 110, a control logic 120, a voltage generator 130, a row decoder 140, and a page buffer 150. Although not shown in FIG. 2, the memory device 100 may further include an input/output circuit or an input/output interface. Elements that are included in the memory device 100 will now be explained in detail.

The memory cell array 110 may be connected to the plurality of word lines WL and the plurality of bit lines BL. Although not shown in FIG. 2, the memory cell array 110 may be connected to at least one string selection line SSL and at least one ground selection line GSL. The memory cell array 110 may include a plurality of memory cells (MC of FIG. 4 or MC1 through MC8 of FIG. 6) that are provided at intersections between the plurality of word lines WL and the plurality of bit lines BL. Each of the plurality of memory cells may store 1-bit data or multi-bit data.

When an erase voltage is applied to the memory cell array 110, the plurality of memory cells MC change to an erase state, and when a program voltage is applied to the memory cell array 110, the plurality of memory cells MC change to a program state. In this case, each of the memory cells MC may have an erase state E and at least one program state that are divided according to a threshold voltage Vth.

In an exemplary embodiment, when the memory cell MC is a single-level cell, the memory cell MC may have an erase state E and a program state P. In another exemplary embodiment, the memory cell MC may have at least one from among first through nth program states P1 through Pn, and n may be a natural number equal to or greater than 3. In an exemplary embodiment, when the memory cell MC is a multi-level cell, n is 3. In another exemplary embodiment, when the memory cell MC is a triple-level cell, n is 7.

The memory cell array 110 may include at least one selected from a single-level cell block including single-level cells, a multi-level cell block including multi-level cells, and a triple-level cell block including triple-level cells. In other words, some memory blocks from among the plurality of memory blocks that are included in the memory cell array 110 may be single-level cell blocks and other memory blocks may be multi-level cell blocks or triple-level cell blocks.

The control logic 120 may output various control signals for writing data to the memory cell array 110 or reading data from the memory cell array 110 based on the command CMD, the address ADDR, and the control signal CTRL that are received from the memory controller 200. Accordingly, the control logic 120 may generally control various operations in the memory device 100.

The various control signals that are output from the control logic 120 may be applied to the voltage generator 130, the row decoder 140, and the page buffer 150. In detail, the control logic 120 may apply a voltage control signal CTRL_vol to the voltage generator 130, a row address X_ADDR to the row decoder 140, and a column address Y_ADDR to the page buffer 150. However, the inventive concept is not limited thereto, and the control logic 120 may further apply other control signals to the voltage generator 130, the row decoder 140, and the page buffer 150.

The voltage generator 130 may generate various types of voltages for performing a program operation, a read operation, and an erase operation on the memory cell array 110 based on the voltage control signal CTRL_vol. In detail, the voltage generator 130 may generate a word line driving voltage VWL for driving the plurality of word lines WL. In this case, the word line driving voltage VWL may be a program voltage (or a write voltage), a read voltage, an erase voltage, an inhibit voltage, or a program verify voltage. Although not shown in FIG. 2, the voltage generator 130 may further generate a string selection line driving voltage VSSL for driving the plurality of string selection lines SSL and a ground selection line driving voltage VGSL for driving the plurality of ground selection lines GSL.

The row decoder 140 may be connected to the memory cell array 110 through the plurality of word lines WL, and may activate some word lines from among the plurality of word lines WL in response to the row address X_ADDR that is received from the control logic 120. In detail, during a read operation, the row decoder 140 may apply a read voltage to a selected word line and may apply an inhibit voltage to a non-selected word line. Also, during a program operation, the row decoder 140 may apply a program voltage to a selected word line and may apply an inhibit voltage to a non-selected word line.

The page buffer 150 may be connected to the memory cell array 110 through the plurality of bit lines BL. In detail, during a read operation, the page buffer 150 may output the data DATA that is stored in the memory cell array 110 by operating a sense amplifier. During a program operation, the page buffer 150 may input the data DATA to be stored to the memory cell array 110 by operating a write driver.

Figure 3:
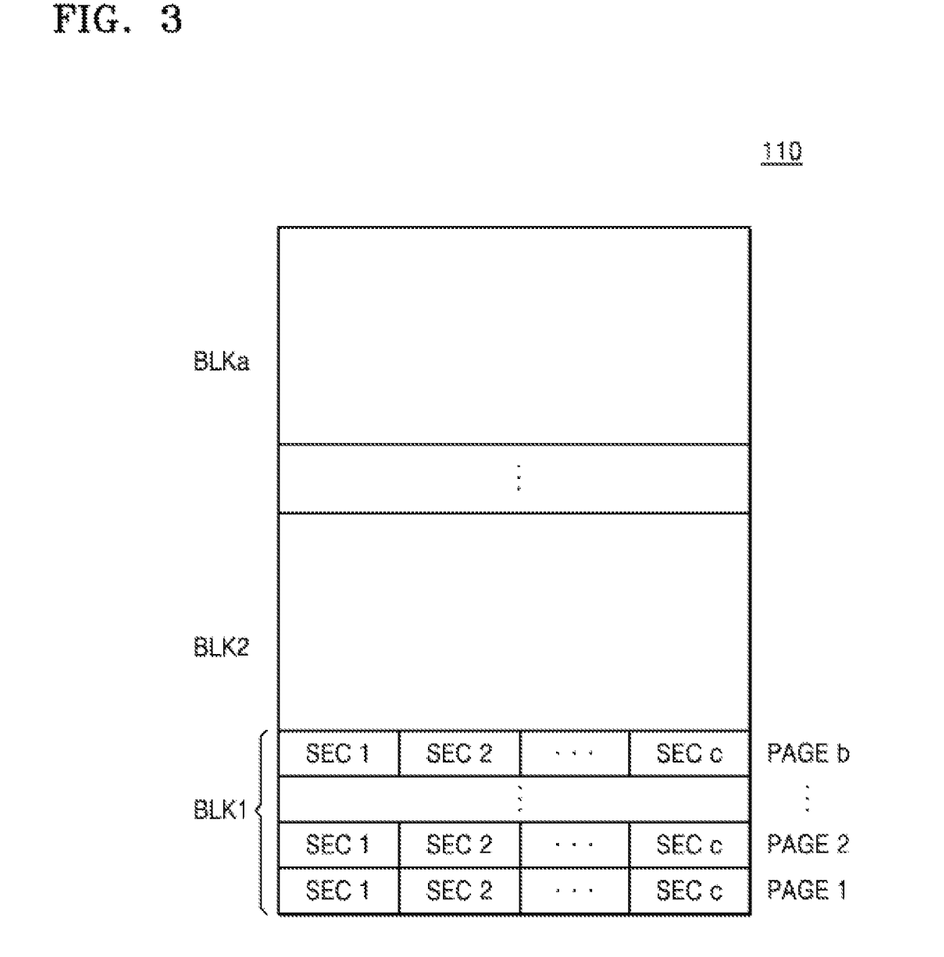
FIG. 3 is a diagram illustrating a memory cell array that is included in the memory device of FIG. 2, according to an exemplary embodiment.

FIG. 3 is a diagram illustrating the memory cell array 110 that is included in the memory device 100 of FIG. 2, according to an exemplary embodiment. Referring to FIG. 3, the memory cell array 110 may be a flash memory cell array. In this case, the memory cell array 110 may include a (a is an integer equal to or greater than 2) memory blocks, that is, first through ath memory blocks BLK1 through BLKa, each of the first through ath memory blocks BLK1 through BLKa may include b (b is an integer equal to or greater than 2) pages PAGE1 through PAGEb, and each of the pages PAGE1 through PAGEb may include c (c is an integer equal to or greater than 2) sectors SEC1 through SECc. Although the pages PAGE1 through PAGEb and the sectors SEC1 through SECc of only the first memory block BLK1 are shown in FIG. 3 for convenience, the other memory blocks, that is, the second through ath memory blocks BLK2 through BLKa, may have the same structures as that of the first memory block BLK1.

Figure 4:
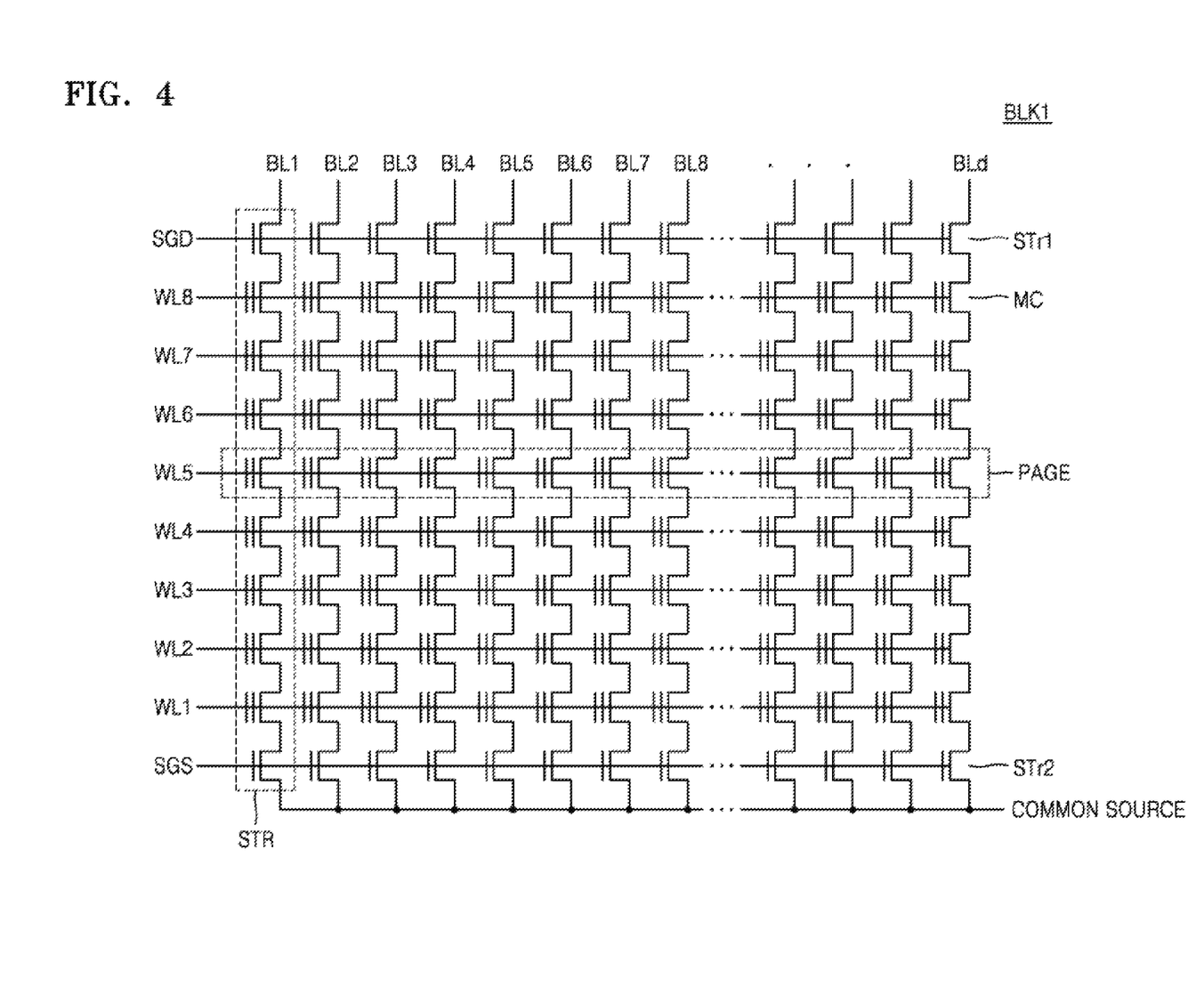
FIG. 4 is a circuit diagram illustrating a memory block that is included in the memory cell array of FIG. 3, according to an exemplary embodiment.

FIG. 4 is a circuit diagram illustrating the first memory block BLK1 that is included in the memory cell array 110 of FIG. 3, according to an exemplary embodiment. Referring to FIG. 4, the first memory block BLK1 may be a horizontal NAND flash memory block, and each of the first through ath memory blocks BLK1 through BLKa of FIG. 3 may be formed as shown in FIG. 4. The first memory block BLK1 may include, for example, d (d is an integer equal to or greater than 2) strings STR to which 8 memory cells are serially connected. Each of the strings STR may include a drain selection transistor STr1 and a source selection transistor STr2 that are respectively connected to both ends of the memory cells MC that are serially connected. The number of the strings STR, the number of the word lines WL, and the number of the bit lines BL may be changed in various ways according to exemplary embodiments.

The NAND flash memory device of FIG. 4 may allow an erase operation to be performed in units of memory blocks and may allow a program operation to be performed in units of pages corresponding to word lines WL1 through WL8. For example, when the memory cell MC is a single-level cell, one page may correspond to each word line. Alternatively, when the memory cell MC is a multi-level cell or a triple-level cell, a plurality of pages may correspond to each word line.

Figure 5:
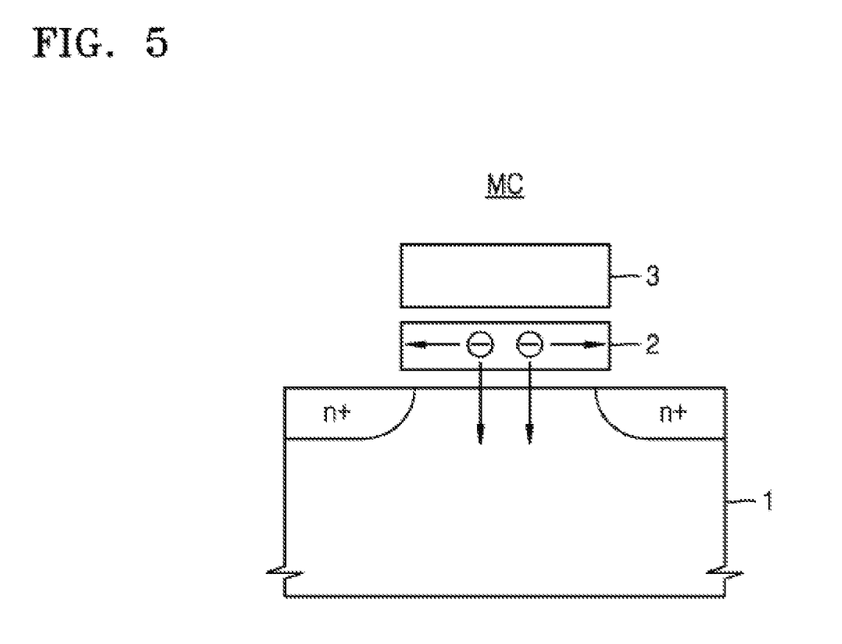
FIG. 5 is a cross-sectional view illustrating a memory cell that is included in the memory block of FIG. 4, according to an exemplary embodiment.

FIG. 5 is a cross-sectional view illustrating the memory cell MC that is included in the first memory block BLK1 of FIG. 4, according to an exemplary embodiment. Referring to FIG. 5, the memory cell MC may include a channel region 1, a charge storage layer 2, and a control gate 3. For example, the charge storage layer 2 may include a floating gate that is a conductor, and in this case, the memory cell MC may be referred to as a floating gate structure cell. Alternatively, the charge storage layer 2 may include, for example, silicon nitride (SiN) that is a non-conductor, and in this case, the memory cell MC may be referred to as a charge trap flash (CTF) cell.

To perform a program operation on the memory cell MC, a relatively high program voltage may be applied to the control gate 3 and a relatively low voltage (for example, 0 V) may be applied to the channel region 1. Since an electric field is formed in a direction from the control gate 3 to the channel region 1 according to such a bias condition, charges, for example, electrons, may move from the channel region 1 to the charge storage layer 2, and thus the memory cell MC may be programmed.

When the memory device 100 is a flash memory device, data that is stored in the memory cell MC may be read according to the threshold voltage Vth of the memory cell MC. In this case, the threshold voltage Vtgh of the memory cell MC may be determined by the number of electrons that are stored in the charge storage layer 2. In detail, as the number of electrons that are stored in the charge storage layer 2 increases, the threshold voltage Vth of the memory cell MC may increase.

Figure 6:
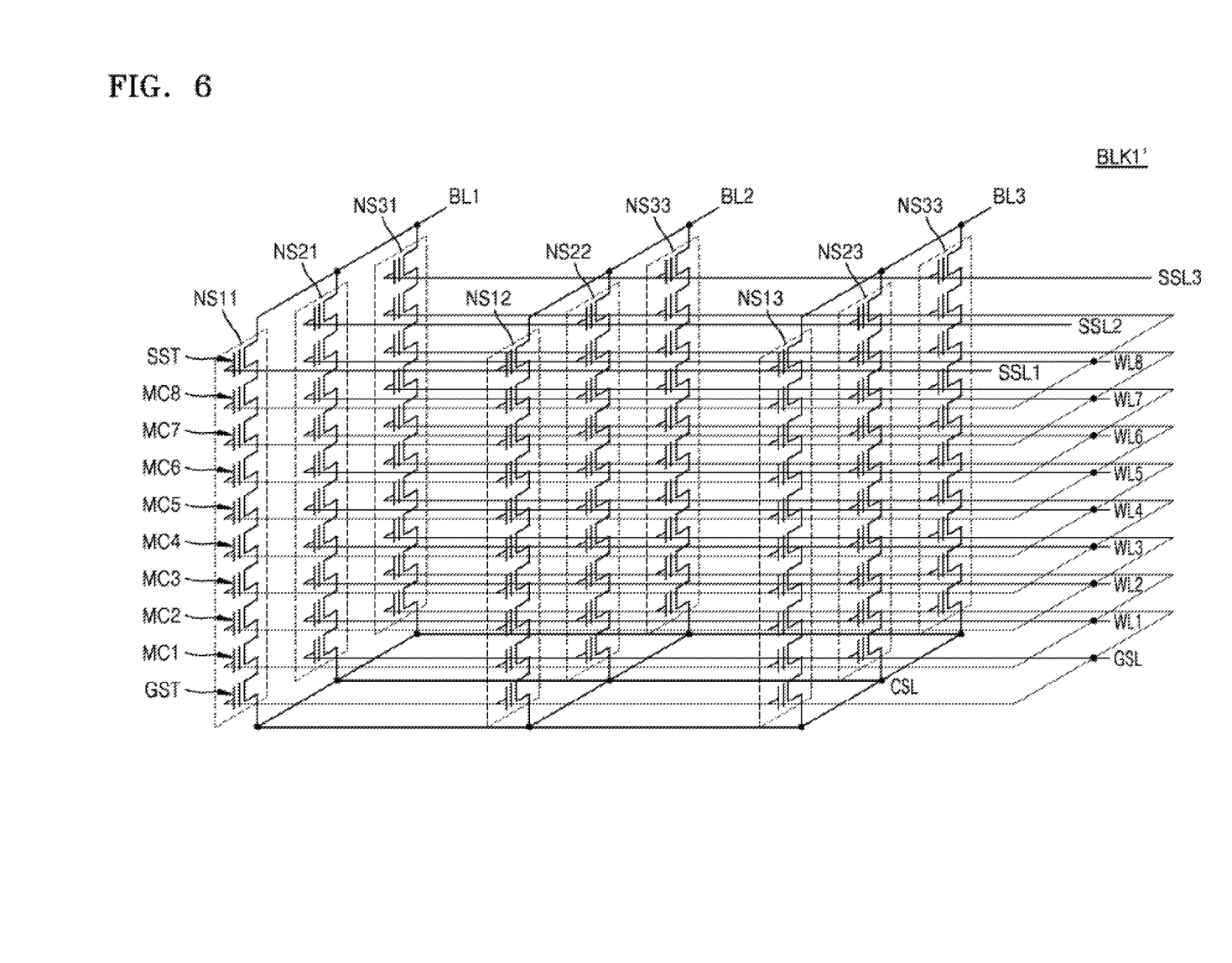
FIG. 6 is a circuit diagram illustrating a memory block that is included in the memory cell array of FIG. 3, according to another exemplary embodiment.

FIG. 6 is a circuit diagram illustrating a first memory block BLK1' that is included in the memory cell array 110 of FIG. 3, according to another exemplary embodiment. Referring to FIG. 6, the first memory block BLK1' may be a vertical NAND flash memory block, and the first through ath memory blocks BLK1 through BLKa of FIG. 3 may be formed as shown in FIG. 6. The first memory block BLK1' may include a plurality of NAND strings NS11 through NS33, the plurality of word lines WL1 through WL8, a plurality of bit lines BL1 through BL3, the ground selection line GSL, a plurality of string selection lines SSL1 through SSL3, and a common source line CSL. The number of the NAND strings, the number of the word lines, the number of the bit lines, the number of the ground selection lines, and the number of the string selection lines may be changed in various ways according to exemplary embodiments.

The NAND strings NS11 through NS33 are connected between the bit lines BL1 through BL3 and the common source line CSL. Each of the NAND strings NS11 through NS33 (for example, NS11) may include a string selection transistor SST, the plurality of memory cells MC1 through MC8, and a ground selection transistor GST that are serially connected.

The string selection transistor SST is connected to the string selection lines SSL1 through SSL3. The plurality of memory cells MC1 through MC8 are respectively connected to the word lines WL1 through WL8. The ground selection transistor GST is connected to the ground selection line GSL. The string selection transistor SST is connected to the bit line BL corresponding to the string selection transistor SST, and the ground selection transistor GST is connected to the common source line CSL.

Word lines having the same height (for example, the word lines WL1) are commonly connected, and the string selection liens SSL1 through SSL3 are separated from one another. When memory cells that are connected to the first word lines WL1 and belong to the NAND strings NS11, NS12, and NS13 are programmed, the first word line WL1 and the first string selection line SSL1 are selected.

Figure 7:
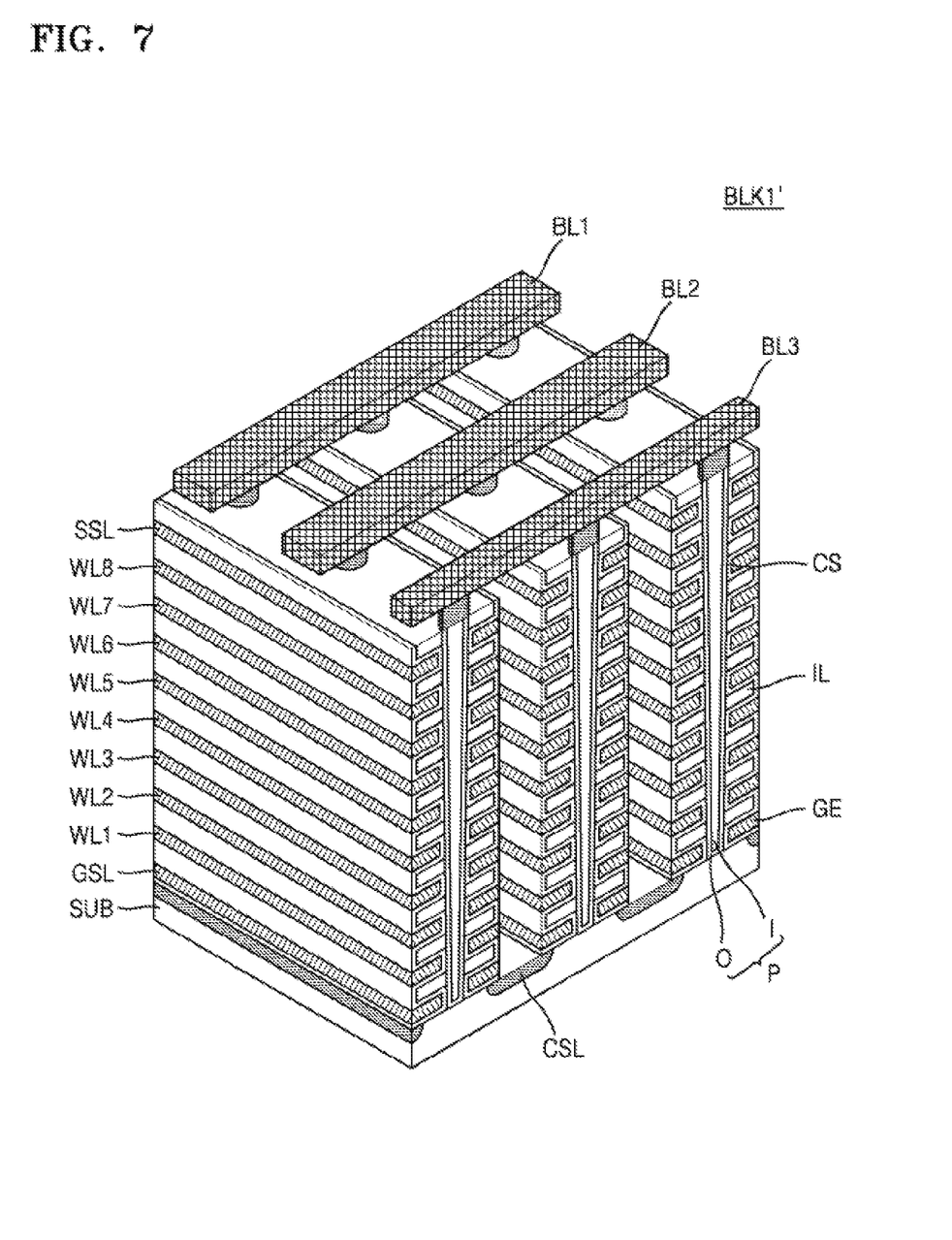
FIG. 7 is a perspective view illustrating the memory block of FIG. 6, according to an exemplary embodiment.

FIG. 7 is a perspective view illustrating the first memory block BLK1' of FIG. 6, according to an exemplary embodiment. Referring to FIG. 7, the first memory block BLK1' is formed in a direction that is perpendicular to a substrate SUB. The common source line CSL is disposed in the substrate SUB, and gate electrodes GE and insulating layers IL are alternately stacked on the substrate SUB. Also, a charge storage layer CS may be formed between the gate electrodes GE and the insulating layers IL.

When the plurality of gate electrodes GE and the plurality of insulating layers IL that are alternately stacked are vertically patterned, a pillar P having a V-shape is formed. The pillar P passes through the gate electrodes GE and the insulating layers IL and is connected to the substrate SUB. An outer portion O of the pillar P may be formed of a semiconductor material and may function as a channel region, and an inner portion I of the pillar P may be formed of an insulating material such as silicon oxide.

The gate electrodes GE of the first memory block BLK1' may be connected to the ground selection line GSL, the plurality of word lines WL1 through WL8, and the string selection line SSL. The pillar P of the first memory block BLK1' may be connected to the plurality of bit lines BL1 through BL3. Although the first memory block BLK1' includes two selection lines GSL and SSL, eight word lines WL1 through WL8, and three bit lines BL1 through BL3 in FIG. 7, the number of the elements is not limited thereto and various modifications may be made.

Figure 8:
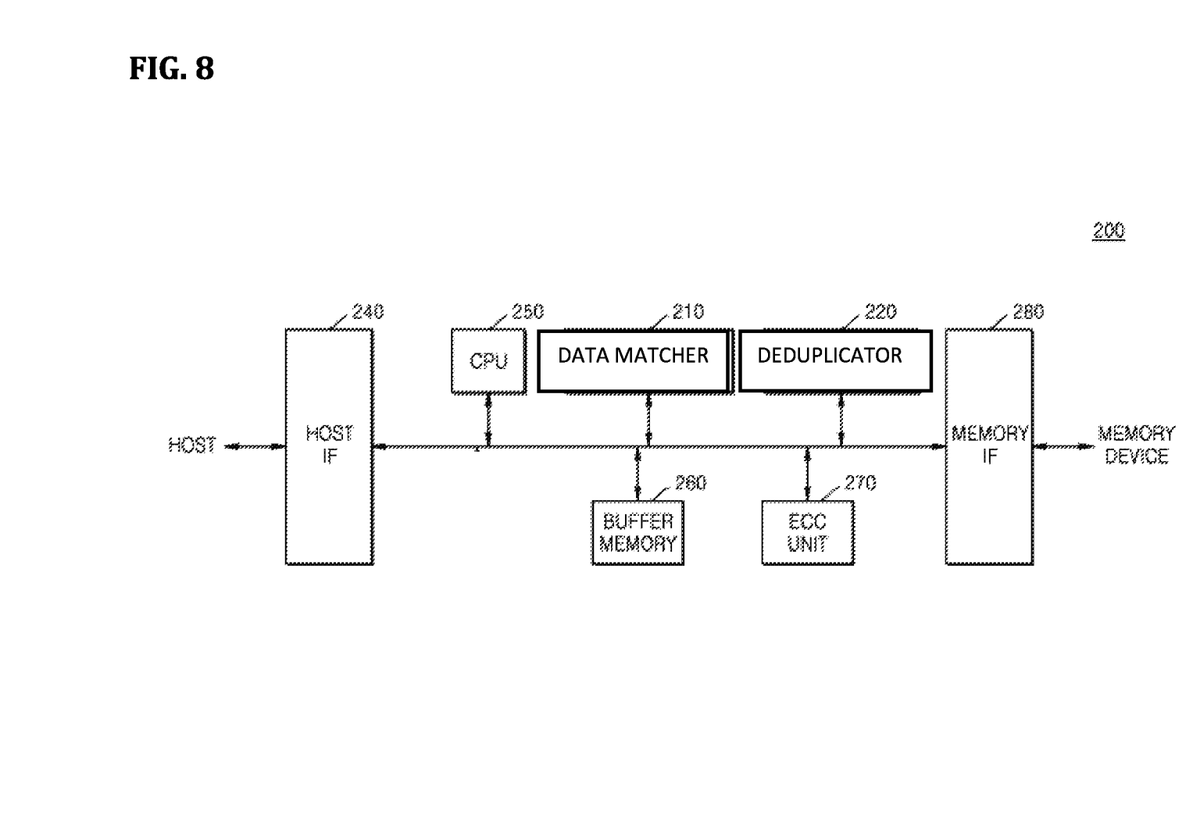
FIG. 8 is block diagram illustrating a memory controller that is included in the memory system of FIG. 1 according to an exemplary embodiment.

FIG. 8 is a detailed block diagram illustrating the memory controller 200 that is included in the memory system 10 of FIG. 1, according to an exemplary embodiment. Referring to FIG. 8, the memory controller 200 may include the data matcher 210, the data deduplicator 220, a host interface 240, a central processing unit (CPU) 250, a buffer memory 260, an error correction code (ECC) unit 270, and a memory interface 280.

The host interface 240 may receive a request of a memory operation from a host by interfacing with the host. In detail, the host interface 240 may receive various requests such as a data read request and a data write request from the host, and generates various internal signals for the memory operation of the memory device 100 in response to the various requests. For example, the memory controller 200 may be configured to communicate with the host through at least one selected from various interface protocols such as a universal serial bus (USB), multimedia card (MMC), peripheral component interconnect-express (PCI-E), advanced technology attachment (ATA), serial-ATA, parallel-ATA, small computer system interface (SCSI), enhanced small disk interface (ESDI), and integrated drive electronics (IDE).

The CPU 250 may control an overall operation of the memory controller 200. For example, the CPU 250 may control various functional blocks related to the memory operation of the memory device 100. Although the data matcher 210 and the data deduplicator 220 are shown as separate blocks in the present exemplary embodiment, such features may operate as a part of the CPU 250.

The buffer memory 260 may temporarily store data that is transmitted to the outside through the host interface 240 and data that is transmitted from the memory device 100 through the memory interface 280. Also, the buffer memory 260 may temporarily store information that is necessary to control the memory device 100. For example, although the buffer memory 260 may be a dynamic RAM (DRAM), a static RAM (SRAM), or a combination of the DRAM and the SRAM, the inventive concept is not limited thereto.

The ECC unit 270 may perform ECC encoding on write data and ECC decoding on read data by using an algorithm such as a Reed-Solomon (RS) code, a Hamming code, or a cyclic redundancy code (CRC), may generate an error detection result from data that is read from the memory device 100, and may perform error correction on the read data. For example, the ECC unit 270 may detect an error bit by comparing a parity bit that is generated and stored when data is programmed with a parity bit that is generated when data is read, and may correct the error bit by performing a predetermined logic operation (for example, exclusive OR (XOR)) on the detected error bit.

The memory interface 280 may interface with the memory device 100 to transmit and receive various signals (for example, a command, an address, and a read voltage control signal) that are generated in the memory controller 200.

The memory controller 200, including data matcher 210 and deduplicator 220, may provide for occasional joint programming or writing of two or more data sectors (e.g. two logical NAND sectors) in one physical page. For example, a physical page may store a data sector that occupies only a portion of that physical page. This can occur, for example, as a result of deduplication or compression. So, in accordance with a present embodiment, the memory controller 200 may control the memory device 100 to store a newly arrived data sector (e.g. A) in the available space of a physical page that is already partially occupied at the time of the arrival by another data sector (e.g. B).

As such, the deduplicator 220 performs a deduplication to find a data sector B, similar to the new data sector A, where B is stored in a partially occupied physical page. The deduplication operation is utilized to store the write data sector A in the physical page that contains written data sector B with available space that is less than a certain amount. This embodiment may include activation of a "partial page writing mode", which means that after a page is programmed, an additional programming is allowed without erasing. For MLCs or TLCs, data sectors of the new block can be written into the physical page of a block at alternating word lines WLs, e.g. in order to minimize a coupling effect.

In an example, a dynamic set of data sectors $S_d$ are previously written in partially occupied physical pages of a block in the memory device 100 (e.g. a NAND flash memory device). A new set data sectors $S_n$ arrives from the HOST for storage. In this case, there is a difference Δ between the data sector $s_1$ of the set $S_d$ and data sector $s_2$ of the set $S_n$ as determined by the data matcher 210. Using deduplication, $s_1$ and Δ together are sufficient to decode $s_2$. So, the deduplicator 220 programs or writes the difference Δ in the physical page of $s_1$, for example, as long as there is available space in the physical page and coupling does not prevent the rewriting.

In various embodiments, a goal is to reduce or minimize the difference Δ between the data sectors $s_1$ and $s_2$, in order to improve the efficiency of deduplication. Therefore, for the sets $S_d$ and $S_n$, finding an appropriate matching between the pages of $S_d$ and the pages in $S_n$ may reduce or minimize the difference Δ between pairs of data sectors in $S_d$ and $S_n$.

Finding appropriate matching between the sets $S_d$ and $S_n$, may be related to maximal weighted bipartite matching in graph theory. In the terminology of graph theory, it may be said that bipartite matching sets forth that no two edges are adjacent to the same node (i.e. a data sector). Referring to FIG. 9, the sectors of set $S_d$ represent the nodes of left side of a bipartite graph, and the sectors of set $S_n$ represent the nodes of right side of a bipartite graph. The weight of the edges between $S_d$ and $S_n$ is a similarity measure between the data sectors. For example, in one embodiment the similarity measure can be one (1) if the size of the difference Δ between a data sector in $S_d$ and a data sector in $S_n$, is less than the remaining storage space of the related physical page and zero (0) otherwise.

The approach's goal may be maximization of the sum of the weights. Pairs of data sectors which have a smaller difference Δ will occupy less space in the memory device 100 when they are deduplicated together. Therefore, matching such data sectors together is desirable. Maximal weighted bipartite matching can be used to maximize the number of new data sectors that can be stored in partially occupied physical pages. It is noted that there are some related algorithms in graph theory, such as the "Hungarian algorithm" or an approximation algorithm that can be utilized to find the optimal matching between the two sets.

So, the matching may maximize the number of pairs of data sectors that can be deduplicated to joint storage in the same physical page. As illustrated in FIG. 10, for a written data sector $s_1$ in the set $S_d$, the results of the matching, deduplication and rewrite are shown in the physical page P where the data sector $S_2$ and the difference Δ are now stored, and also represent the data sector $S_1$. The above described matching and deduplication also applies to pairs of data sectors that include write data sectors and other write data sectors.

Figure 11:
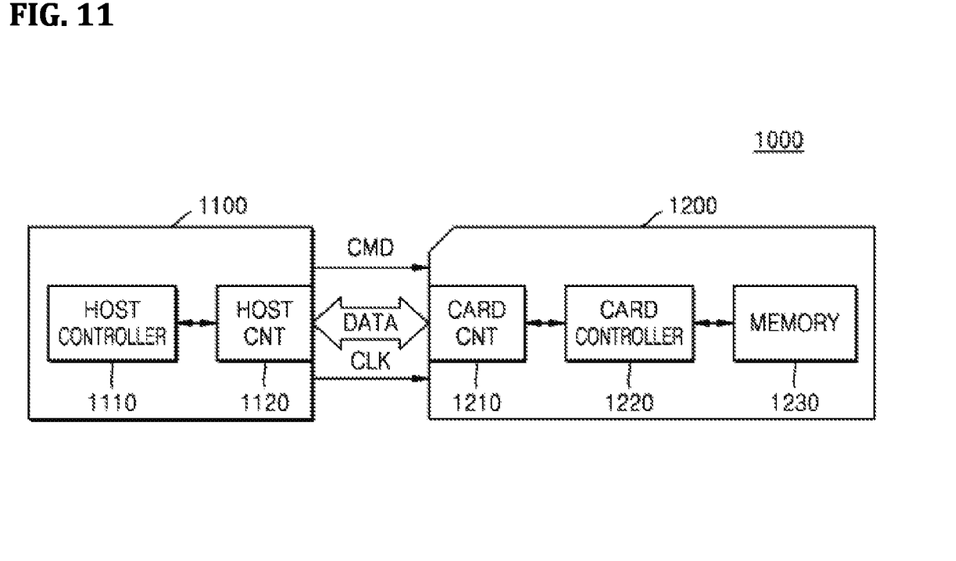
FIG. 11 is a block diagram illustrating a memory card system to which a memory system is applied, according to an exemplary embodiment.

FIG. 11 is a block diagram illustrating a memory card system 1000 to which a memory system is applied, according to an exemplary embodiment. Referring to FIG. 11, the memory card system 1000 may include a host 1100 and a memory card 1200. The host 1100 may include a host controller 1110 and a host connector 1120. The memory card 1200 may include a card connector 1210, a card controller 1220, and a memory device 1230. In this case, the memory card 1200 may be formed by using the exemplary embodiments of FIGS. 1 through 10.

The host 1100 may write data to the memory card 1200 or may read data that is stored in the memory card 1200. The host controller 1110 may transmit a command CMD, a clock signal CLK that is generated by a clock generator (not shown) in the host 1100, and data DATA to the memory card 1200 through the host connector 1120.

The card controller 1220 may store the data DATA in the memory device 1230 in synchronization with a clock signal that is generated by a clock generator (not shown) in the card controller 1220, in response to the command CMD received through the card connector 1210. The memory device 1230 may store the data DATA that is transmitted from the host 1100.

The memory card 1200 may be a compact flash card (CFC), a microdrive, a smart media card (SMC), a multimedia card (MMC), a security digital card (SDC), a memory stick, or a USB flash memory driver.

Figure 12:
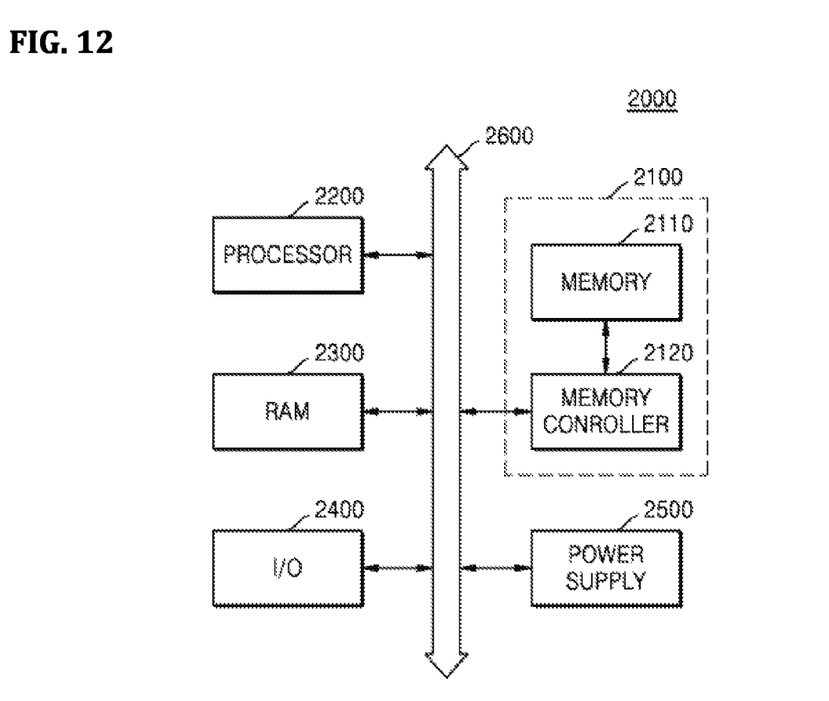
FIG. 12 is a block diagram illustrating a computing system including a memory system, according to an exemplary embodiment.

FIG. 12 is a block diagram illustrating a computing system 2000 including a memory system 2100, according to an exemplary embodiment. Referring to FIG. 12, the computing system 2000 may include the memory system 2100, a processor 2200, a RAM 2300, an input/output device 2400, and a power supply 2500. Although not shown in FIG. 12, the computing system 2000 may further include ports that may communicate with a video card, a sound card, a memory card, a USB device, or other electronic devices. The computing system 2000 may be a personal computer, or a portable electronic device such as a laptop computer, a mobile phone, a personal digital assistant (PDA), or a camera.

The processor 2200 may perform specific calculations and tasks. According to exemplary embodiments, the processor 2200 may be a microprocessor or a CPU. The processor 220 may communicate with the RAM 2300, the input/output device 2400, and the memory system 2100 via a bus 2600 such as an address bus, a control bus, or a data bus. In this case, the memory system 2100 may be formed by using the exemplary embodiments of FIGS. 1 through 11.

According to exemplary embodiments, the processor 2200 may be connected to an expansion bus such as a PCI bus.

The RAM 2300 may store data that is necessary to operate the computing system 2000. For example, the RAM 2300 may be a DRAM, a mobile DRAM, an SRAM, a PRAM, a ferroelectric RAM (FRAM), an RRAM, and/or an MRAM.

The input/output device 2400 may include an input unit such as a keyboard, a keypad, and/or a mouse and an output unit such as a printer and/or a display. The power device 2500 may supply an operating voltage that is necessary to operate the computing system 2000.

Figure 13:
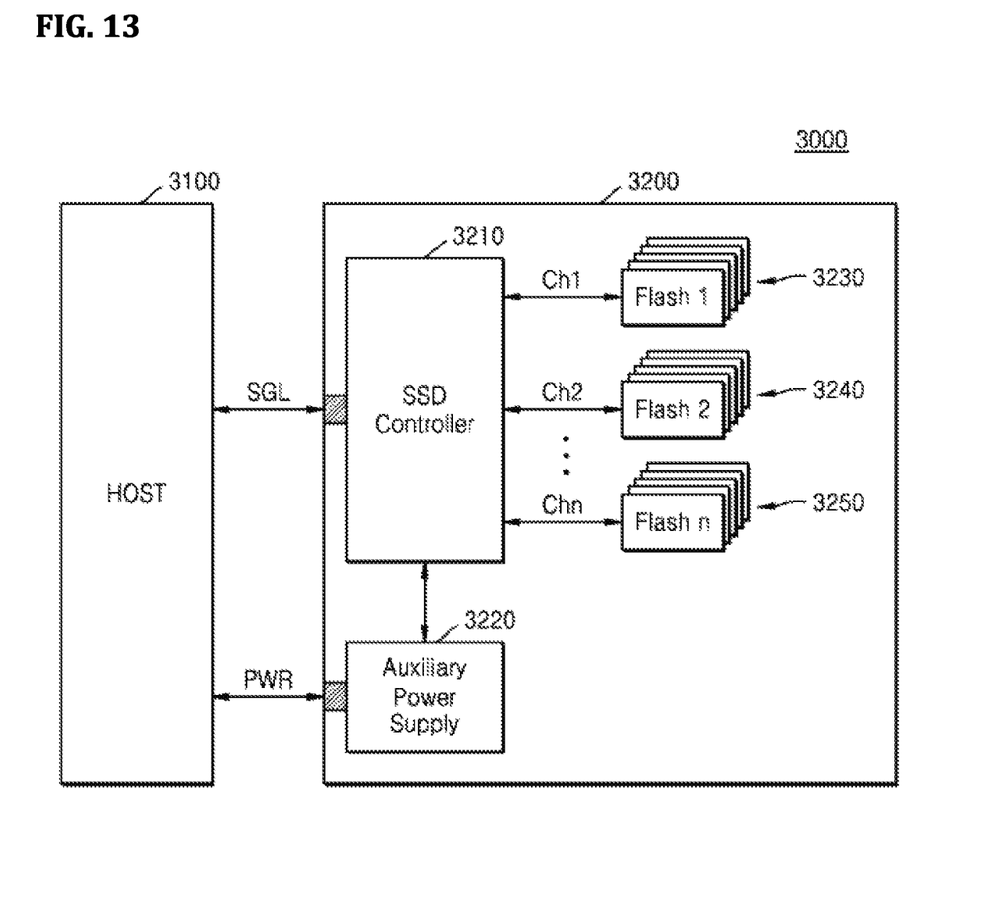
FIG. 13 is a block diagram illustrating a solid-state drive (SSD) system to which a memory system is applied, according to an exemplary embodiment.

FIG. 13 is a block diagram illustrating a solid-state drive (SSD) system 3000 to which a memory system is applied, according to an exemplary embodiment. Referring to FIG. 13, the SSD system 3000 may include a host 3100 and an SSD 3200. The SSD 3200 transmits and receives a signal to and from the host 3100 through a signal connector, and receives power through a power connector. The SSD 3200 may include an SSD controller 3210, an auxiliary power device 3220, and a plurality of memory devices 3230, 3240, and 3250. In this case, the SSD 3200 may be formed by using the exemplary embodiments of FIGS. 1 through 12.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A method, executed by a memory controller, of storing data within a flash memory device having physical pages, each of the physical pages constituting a maximum portion of the flash memory device that is capable of being simultaneously programmed with data and each of the physical pages being capable of storing multiple data sectors, the method comprising:

receiving, from a host device, new data sectors to be stored in the flash memory device;

matching the new data sectors with stored data sectors being previously stored in a physical page of the flash memory device, based upon a maximal weighted bipartite matching, such that sum of weights between the new data sectors and the stored data sectors is maximized, each of the weights between the new data sectors and the stored data sectors is a similarity between corresponding two sectors;

deduplicating the new data sectors and the stored data sectors to define a difference therebetween according to a result of the matching; and writing the difference to an unoccupied portion of the physical page, without overwriting the stored data sectors.

2. The method of claim 1, wherein the similarity is determined by a sub-set of data chunks whose hash function is in a predetermined region.

3. The method of claim 1, wherein the writing is performed on the physical page after a previous programming and before erasing.

4. The method of claim 1, wherein the stored data sectors only partially occupy the physical page.

5. The method of claim 1, wherein the matching maximizes a number of data sector pairs that can be deduplicated.

6. The method of claim 1, wherein the deduplicating is applied to fewer than all of the data sectors, excluding difference data previously acquired through deduplication, within the physical page storing previously-written data.

7. The method of claim 1, wherein:

the physical page comprises an array of memory cells, including multi-level cells (MLC) or triple-level cells (TLC), coupled between word lines and bit lines that address the physical page; and the stored data sectors are addressed by one of the word lines addressing the physical page and the difference is addressed by another of the word lines addressing the physical page.

8. A data storage system comprising:

a flash memory device comprising a physical page for storing multiple data sectors, the physical page constituting a maximum portion of the flash memory device that is capable of being simultaneously programmed with data; and a memory controller that:

receives, from a host device, new data sectors to be stored in the flash memory device;

matches the new data sectors with stored data sectors being previously stored in a physical page of the flash memory device, based upon a maximal weighted bipartite matching, such that sum of weights between the new data sectors and the stored data sectors is maximized, each of the weights between the new data sectors and the stored data sectors is a similarity between corresponding two sectors;

deduplicates the new data sectors and the stored data sectors to define a difference therebetween according to a result of the matching; and writes the difference to an unoccupied portion of the physical page, without overwriting the stored data sectors.

9. The data storage system of claim 8, wherein:

the physical page comprises an array of memory cells, including multi-level cells (MLC) or triple-level cells (TLC), coupled between word lines and bit lines that address the physical page; and the stored data sectors are addressed by one of the word lines addressing the physical page and the difference is addressed by another of the word lines addressing the physical page.

\* \* \* \* \*